(12) United States Patent
Durante et al.

(10) Patent No.: US 7,442,323 B2
(45) Date of Patent: Oct. 28, 2008

(54) POTASSIUM MONOPERSULFATE SOLUTIONS

(75) Inventors: Robert Jeffrey Durante, Landenberg, PA (US); Harvey James Bohn, Jr., Boothwyn, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/445,610

(22) Filed: Jun. 2, 2006

(65) Prior Publication Data

US 2007/0278182 A1    Dec. 6, 2007

(51) Int. Cl.
*C09K 13/00* (2006.01)
(52) U.S. Cl. .................. 252/79.1; 252/79; 252/79.2; 216/83; 216/96; 216/100; 216/88; 423/513; 423/551; 510/201; 510/302
(58) Field of Classification Search ............... 252/79.1; 216/88; 510/201
See application file for complete search history.

(56) References Cited

U.S. PATENT DOCUMENTS

| | | | |
|---|---|---|---|
| 3,555,147 A | 1/1971 | Mucenieks et al. | |
| 3,805,809 A | 4/1974 | Zeffren et al. | |
| 5,139,763 A | 8/1992 | Amini | |
| 5,250,280 A | 10/1993 | Bertsch-Frank et al. | |
| 5,607,656 A | 3/1997 | Soicke et al. | |
| 6,818,142 B2 * | 11/2004 | Tufano et al. | 216/83 |
| 2003/0228762 A1 * | 12/2003 | Moeggenborg et al. | 438/691 |
| 2004/0112869 A1 * | 6/2004 | Carter et al. | 216/101 |
| 2005/0062017 A1 * | 3/2005 | Martin | 252/186.1 |
| 2005/0063895 A1 | 3/2005 | Martin | |
| 2005/0261152 A1 * | 11/2005 | Carter et al. | 510/201 |
| 2006/0013751 A1 * | 1/2006 | Martin et al. | 422/241 |

OTHER PUBLICATIONS

"Oxone Monopersulfate Compound Technical Information" Bulletin, No. H-42434-5, dated Apr. 2000, published by E. I. du Pont de Nemours and Company.

* cited by examiner

*Primary Examiner*—Nadine Norton
*Assistant Examiner*—Maki A. Angadi

(57) ABSTRACT

A composition comprising a solution of potassium monopersulfate having an active oxygen content of from about 3.4% to about 6.8% and a process for its preparation including neutralization with an alkaline material is disclosed.

14 Claims, No Drawings

POTASSIUM MONOPERSULFATE SOLUTIONS

FIELD OF THE INVENTION

This invention relates to a high-strength solution of potassium monopersulfate triple salt having a high active oxygen content, a process for its preparation, and its use in the manufacture of printed wiring boards and semiconductors.

BACKGROUND OF THE INVENTION

Trademarks are hereinafter shown in upper case.

The term "potassium monopersulfate" is commonly used in the trade, and is used herein to refer to the mixed triple salt $2KHSO_5 \cdot KHSO_4 \cdot K_2SO_4$. The term "$KHSO_5$", the formula of the active component in the triple salt, is used herein specifically to denote potassium hydrogen peroxymonosulfate.

Potassium monopersulfate as a solid has a theoretical active oxygen content of 5.2%, but as the commercially available solid mixed triple salt, has a typical active oxygen content of about 4.7%. It is recognized that the purity of commercially available potassium monopersulfate is about 95% to about 98% due to the presence of minor impurities, minor amounts of additives (such as an anti-caking agent), and variations in manufacturing processes. "Active oxygen" (AO) is defined as the amount of oxygen in the potassium monopersulfate triple salt in excess of that required to form the corresponding bisulfate. It may be calculated as a percentage from the equation for the decomposition of the monopersulfate, $$KHSO_5 \rightarrow KHSO_4 + [O]$$

$$\text{Percent } AO = \frac{\text{Weight of } [O] \times 100}{\text{Weight of } KHSO_5}$$

wherein AO represents the active oxygen and [O] is the oxygen liberated by the decomposition shown. In applying the formula given, the weight of $KHSO_5$ is replaced by the weight of sample where impure material is used. Active oxygen can, of course, be determined from many reactions, the displacement of iodine from potassium iodide, for example, being quantitative. The active oxygen in potassium monopersulfate is available for production of molecular oxygen or for use in various oxidation reactions.

Potassium monopersulfate has a number of uses, including in the microetching of printed wiring boards, also known as printed circuit boards. Tufano, et al., in U.S. Pat. No. 6,818,142 describe a composition and a microetching process using potassium monopersulfate microetching solutions having low inert sulfate concentrations and high weight percent active oxygen. The composition comprised a solution of potassium monopersulfate having a minimum active oxygen content, at an equivalent temperature, equal to from about 1.5 to about 5.5 times the active oxygen content of the triple salt potassium monopersulfate when the potassium monopersulfate is completely dissolved. This is an active oxygen content of 0.7% to 3.36% for the Tufano et al. solutions. The process for the preparation of the solution comprised mixing solid potassium monopersulfate with a quantity of water insufficient to completely dissolve the solid, mixing to form an equilibrated slurry, and separating undissolved solids to obtain a solution. However, it is desired to have potassium monopersulfate solutions having even higher active oxygen content. Further, the storage stability of the Tufano et al. solutions has not been maximized. The insolubility of inert solids that precipitate during storage or shipping remains a problem.

It is desirable to have stable solutions of potassium monopersulfate that have a higher active oxygen content for various uses. It is also desirable to improve the process for microetching of printed wiring boards through use of concentrated aqueous microetching solutions providing lower inert sulfate concentrations and higher weight percent active oxygen. It is also desirable to eliminate the insolubility of components that precipitate as inert solids during storage and/or shipping of potassium monopersulfate solutions. In all applications, the availability of higher active oxygen solutions is more desirable along with minimized inert sulfate salts. The present invention provides such solutions.

SUMMARY OF THE INVENTION

The present invention comprises a composition comprising a solution of potassium monopersulfate having an active oxygen content of from about 3.4% to about 6.8%.

The present invention further comprises a process for the preparation of a solution of potassium monopersulfate having an active oxygen content of from about 3.4% to about 6.8% comprising a) mixing to form an equilibrated slurry i) solid $2KHSO_5 \cdot KHSO_4 \cdot K_2SO_4$, ii) a quantity of water insufficient to completely dissolve the solid, and iii) an alkaline material, and b) separating undissolved solids to obtain a solution.

The present invention further comprises an improved method of microetching a surface wherein the improvement comprises contacting the surface to be etched with a microetching solution containing a potassium monopersulfate solution having an active oxygen content of from about 3.4% to about 6.8%.

DETAILED DESCRIPTION

The present invention comprises an aqueous high strength solution of potassium monopersulfate having an active oxygen content of from about 3.4% to about 6.8% by weight, and a neutralization process for its preparation. The process comprises mixing solid potassium monopersulfate triple salt ($2KHSO_5, KHSO_4, K_2SO_4$), a quantity of water insufficient to completely dissolve the solid, and an alkaline material to form an equilibrated slurry, and then separating undissolved solids to obtain the solution of the present invention. Alternatively, the triple salt and water are combined to form a slurry, and then the alkaline material is added to neutralize the potassium bisulfate present in the slurry. Undissolved solids are then separated to obtain the high active oxygen solution of potassium monopersulfate of the present invention.

Hereinafter all solubilities and concentrations are provided in grams of solid dissolved in 100 g of water and all concentrations as weight percent or g/100 g solution. As an example for the approximate interconversion, 10 g solute/100 g water corresponds to $100 \times 10/(10+100)$ or 9.1 weight percent since the specific gravity of water approximates 1.0 at or near room temperature. The solubility of the potassium monopersulfate triple salt in water at 20° C. is about 30 g/100 g water (more detail at varying temperatures is shown in Table 1 below), providing an active oxygen concentration of about 1.0 to about 1.1%.

TABLE 1

| Temp. | Triple Salt* (g) | % Active Oxygen in saturated solution | Component Salts | | |
|---|---|---|---|---|---|
| | | | KHSO$_5$, g | KHSO$_4$, g | K$_2$SO$_4$, g |
| 0° C. | 11 | 0.47 | 51 | 37 | 8 |
| 10° C. | 21 | 0.82 | 61 | 45 | 10 |
| 20° C. | 30 | 1.08 | 72 | 53 | 11 |
| 30° C. | 34 | 1.20 | 83 | 61 | 13 |
| 40° C. | 42 | 1.39 | 93 | 70 | 14 |
| 50° C. | 44 | 1.44 | 104 | 79 | 16 |

*Complete saturated solution of commercially available 2KHSO$_5$•KHSO$_4$•K$_2$SO$_4$ The term "complete saturated solution" as applied to potassium monopersulfate is used herein to mean potassium monopersulfate solutions of the prior art wherein the salts are completely (100%) dissolved. Potassium monopersulfate solutions have more limited stability than the anhydrous triple salt in granulated form. For example, a solution containing 0.5% active oxygen will show loss of 10% of its active oxygen in 57 days at 22° C., or a half life of 910 days, compared with a loss of 10% active oxygen, for solid potassium monopersulfate, in 304 days or a half life of 1520 days stored at room temperature. This stability of the potassium monopersulfate solutions is only sufficient for uses where the solution is to be used within a few weeks, depending upon storage temperature. The composition of the present invention provides a more concentrated solution having better storage stability than a complete saturated solution of the triple salt.

Table 1 shows the solubility limits of complete saturated solutions of OXONE and of each component in the triple salt. The active oxygen generated by the triple salt is much lower than what is attainable from the limit of the KHSO$_5$ independently. From Table 1 it can be seen that at 20° C. a complete saturated solution of the triple salt (30 g in 100 g deionized water) would have an active oxygen concentration of $$(0.47 \times 30)/(100+30) = 0.0108 (1.08\%)$$

The compositions of US Pat. No. 6,818,142 have an active oxygen content of 0.7% to 3.36%. In contrast, the composition of the present invention comprises a solution of potassium monopersulfate having an enhanced level of KHSO$_5$, and having an active oxygen level from about 3.4% to about 6.8% by weight, while also containing reduced concentrations of other inert salts.

Preferably the active oxygen content of the composition of the present invention is from about 3.5% to about 6.8% percent by weight, alternatively from about 3.6% to about 6.8% percent by weight, alternatively from about 3.6% to about 6.0% percent by weight, alternatively from about 3.6% to about 5.4% percent by weight, alternatively from 3.8% to about 5.4% percent by weight, or alternatively from about 4.0% to about 5.0% percent by weight. Active oxygen content higher in the range is preferred.

Compared with complete saturated solutions of potassium monopersulfate and the solutions described in U.S. Pat. No. 6,818,142, the solution of the present invention has higher KHSO$_5$ concentrations, and thus higher active oxygen concentration. On an active oxygen basis, the high-strength or concentrated solutions of the present invention also have a lower inert sulfate salt concentration. The compositions of the present invention have a maximum SO$_4$ content of about 5.5%, preferably a maximum of about 5.0%. Lower inert sulfate salts and higher active oxygen provide a composition with commercial advantages for several end uses. The composition has greater storage stability, and requires fewer steps to eliminate undesirable precipitation of inert solids in the drummed or packaged product. With lower inert sulfates values, greater printed circuit board microetching solution life span is realized because of reduced sulfate build up as active oxygen is replenished. This extends the number of printed circuit boards that can be microetched before staining will occur.

The present invention further comprises a process for preparation of the composition of the present invention described above having high active oxygen levels. The process of the present invention comprises slurrying solid potassium monopersulfate, a quantity of water insufficient to completely dissolve the solid, and an alkaline material, followed by mixing to form an equilibrated slurry, and removal of undissolved solids. Optionally, the solid potassium monopersulfate and water are mixed to form an equilibrated slurry, and then the alkaline material is added. Suitable alkaline materials include sodium hydroxide, potassium hydroxide, barium hydroxide, magnesium hydroxide, sodium carbonate, potassium carbonate, sodium bicarbonate or potassium bicarbonate. Potassium hydroxide is the preferred alkaline material.

The following description is a specific embodiment of the process of the present invention based on the use of the preferred potassium hydroxide as the alkaline material. From about 25 g to about 70 g of water per 100 g of triple salt is employed. The minimum processing temperature is greater than 5° C. to maintain sufficiently high KHSO$_5$ solubility. In the preparation of the slurry, deionized water is preferred, with low concentrations of metal ions and low levels of oxidizable organic and inorganic contaminants. Certain heavy metal ions, such as Co, Fe, and Ni, catalyze the decomposition of KHSO$_5$ in aqueous solutions.

The amount of alkaline material is sufficient to neutralize from about 1.0% to about 100% of the KHSO$_4$ content of the triple salt. The slurry is stirred and equilibrated for a length of time sufficient to solubilize the maximum concentration of active KHSO$_5$ component. The slurry time is dependent on such factors as the batch size and agitation, but typically about 3 hours is sufficent, preferabl;y about 2 hours. Neutralization takes place with good agitation and is conducted at a temperature of less than about 40° C., preferably about 15° C., to minimize loss of active oxygen from localized hot spots. Potassium hydroxide solution is preferred as the alkaline material, using a concentration of about 35% to about 40% KOH, again to minimize hot spots. During the neutralization step of the process of the present invention, KHSO$_4$ is converted to the less soluble K$_2$SO$_4$. As the solubility of the K$_2$SO$_4$ is exceeded, the salt precipitates. Excess solids are separated from the clear filtrate by any suitable separation technique, including but not limited to filtration, centrifugation, sedimentation and decantation, and the like. The filtrate or decanted liquid is the high active oxygen solution of the present invention containing elevated levels of KHSO$_5$. The filtrate is typically stored in suitable acid- and oxidation-resistant containers, e.g., high density poly(ethylene), high density poly(propylene) and stainless steel for future use.

Since, in the triple salt 2KHSO$_5$.KHSO$_4$.K$_2$SO$_4$, the KHSO$_5$ component is the most soluble and the K$_2$SO$_4$ component is the least soluble (see Table 1), most of the original potassium sulfate (K$_2$SO$_4$) and the potassium sulfate formed by the partial neutralization of the potassium hydrogen sulfate (KHSO$_4$) remain undissolved or precipitate. The neutralization step utilizes the differing solubilities of the three components of the triple salt to enhance extraction of the active oxygen concentration. From Table 1, when potassium hydroxide is used as the alkaline material, the solubility of KHSO$_4$ is about 4.5 to about 5 times that of K$_2$SO$_4$. Thus the partial neutralization of the KHSO$_4$ component increases the content of the less soluble K$_2$SO$_4$, which, in a limited volume of water, precipitates and is removed. These undissolved solids are then separated from the slurry by any of a number of suitable means as discussed above.

The neutralizing technique results in a high active oxygen solution with various benefits. The process provides four benefits, (i) high active oxygen concentration, (ii) low concentration of inert sulfate salts, (iii) high metal salt solubilities, and (iv) a high active oxygen content availability in the solution when used in various applications, such as metal microetchant and/or cleaner. The concentration ratio of active potassium hydrogen peroxymonosulfate ($KHSO_5$) to inert sulfates is significantly greater than has been made available in the prior art.

While increasing the ratio of potassium monopersulfate triple salt to water results in progressively higher active oxygen values, the yield of $KHSO_5$ progressively decreases. This is due to solution hold-up or filtrate retention in the progressively larger filter cake and, in the highest potassium monopersulfate to water ratio, to the limiting solubility of $K_2SO_4$. In end use or applications of the solutions of the present invention where the highest active oxygen is required, some yield loss of $KHSO_5$ is acceptable. Conversely, decreasing the weight ratio of potassium monopersulfate triple salt to water below about 100:60 provides a high $KHSO_5$ yield but a diminishing advantage in terms of active oxygen content over the prior art.

Depending upon the end use or application of the solution, it is desirable to maximize either the percent active oxygen or the yield of $KHSO_5$. The process of the present invention permits such maximization. The amount of deionized water used is from about 7% to about 21% of the amount required to produce the complete saturated solutions of the triple salt shown in Table 1, and preferably from about 10% to about 21%. Lower percentages of deionized water produce progressively more of the four benefits described above, but the mass of active oxygen yielded based on the mass of the active oxygen in the original triple salt, decreases. It should be noted that yields can be improved by using better "dewatering" separation techniques such as a recessed chamber filter press. Wet cake size plays a large role in simple vacuum filtration.

The high active oxygen solutions of the present invention have stability comparable to the solutions of US Pat. No. 6,818,142 and to complete saturated solutions. Moreover, based strictly on shelf life, because the starting active oxygen of the compositions of the present invention is higher, it takes longer to degrade to a minimum useful or acceptable level. This provides for a longer shelf life for the compositions of the present invention from the same weight of starting material. Table 2 in the Examples below shows the stability of the active oxygen versus time at 35° C. for examples of solutions of the present invention. Loss of active oxygen from the potassium hydrogen peroxymonosulfate ($KHSO_5$) molecule follows first order reaction represented by Equation 1:

$$\log_e C/C_0 = -Kt \qquad \text{Equation 1}$$

where C is concentration, t is time, and K is the rate constant. The rate constant can be found by plotting the natural log of $C/C_0$ vs time, where the negative slope=K. To represent stability as loss of active oxygen one may substitute, for example, $C=(9/10)C_0$ to represent a 10% loss value. By substituting in Equation 1, one gets $$t_{10\%} = \log_e(10/9)/K$$

to represent the number of days it takes to reduce the starting active oxygen by 10%.

The pH of the solution of the present invention can be adjusted by adding acid to obtain a range of pH of from about 0.4 to about 1.5 if desired for particular uses. Conventional acids are suitable for this purpose, but sulfuric acid and phosphoric acid are preferred. There is a balance between higher active oxygen and stability. Lowering of the pH increases stability in terms of producing a smaller rate constant K, but decreases active oxygen through dilution by addition of the acid. Those using the solution of the present invention who require only a short shelf life may prefer the highest active oxygen possible. Another user who wants the active oxygen to remain more consistent for a longer period of time may reduce the active oxygen slightly through dilution by adding acid to lower the pH, but improve stability.

Additional adjuvants may be dissolved in the solutions of the present invention either after the separation from undissolved solids as described above during the preparation process, or at the point of use, to meet specific end-product requirements. Adjuvants are selected having appropriate solubility and stability in the highly acidic and oxidative solution. Types and examples of adjuvants suitable for use in the solutions of the present invention when used as microetch solutions include, but are not limited to, the following examples: mineral acids such as sulfuric, phosphoric and nitric, (but not hydrochloric due to the potential for hazardous chlorine generation); $C_1$ to $C_4$ organic acids; surfactants to improve wettability (such as nonionic, anionic, cationic and amphoteric surfactants); stabilizers such as sodium phenolsulfonate; and etch rate modifiers such as nitrogen-containing heterocyclic compounds such as azole compounds, e.g., benzotriazole.

The high active oxygen solutions of the present invention also have a low concentration of inert sulfate salts. This is measured or calculated after undissolved sulfate salts have been removed, but before any addition of adjuvants such as those listed above. Dilution does not affect the ratio of active oxygen to inert sulfate salts. The active oxygen to sulfate salt weight ratio for the solid potassium monopersulfate triple salt and all complete saturated solutions prepared from commercially available potassium monopersulfate in the prior art is approximately 0.15:1. This is slightly lower than the calculated theoretical value due to the presence of impurities, additives and manufacturing process variations. Since, in the high active oxygen solutions of the present invention, undissolved sulfate salts are removed, the active oxygen to inert sulfate salt weight ratios are significantly higher, ranging from about 0.8:1 to about 1.7:1. Active oxygen and sulfate values for examples of the solutions of the present invention are shown in Tables 2, 3 and 4 in the Examples.

The composition of the present invention is especially useful in preparing microetch concentrates for use in printed wiring board manufacturing. The composition and process of the present invention provide several advantages. High strength potassium hydrogen monopersulfate ($KHSO_5$) concentrates are provided that can be diluted as needed for specific end-uses. The composition of this invention produces solutions having an active oxygen content of about 3.4% to about 6.8%. The higher active oxygen content and reduced inert sufates allows for the addition of water back to the concentrate to improve shipping stability by alleviating saturation, yet provides a high active oxygen liquid material. Lower inert solids content is provided versus the triple salt solutions of the prior art. This is especially useful in microetch applications where bath life can be extendend to improve productivity. The triple salt is typically shipped in its more stable solid form, then converted to a solution form for "just in time" use by regional tollers skilled in chemical handling. Use of the solutions of the present invention eliminates solid dusts from the end user's working environment and provides better industrial hygiene through enhanced worker safety, especially in those cases where proper personal protective equipment is less utilized.

The solution of the present invention is also useful as an auxiliary oxidant or water shock treatment for pools, spas, and other recreational and ornamental waters, including fountains, reflecting pools, ornamental ponds, and the like. It is used to reduce the non-microbial waste content and restore the sparkle and clarity of such bodies of water. It does so without forming the irritating and malodorous chloramines associated with chlorinating products such as calcium hypochlorite. The solutions of the present invention are used in conjunction with EPA-registered sanitizers. In contrast to chlorine bleaches such as calcium hypochlorite, the solution of the present invention provides oxidation without undesirable side effects such as bleaching or fading of vinyl liners, painted surfaces, or swimsuit fabrics. Other uses of the composition of the present invention include its use as the active bleach component in cleaning compositions, a paper repulping aid for the destruction of wet strength resins, an oxidizer in antimicrobial compositions, laundry products, recreational pools, spas, denture cleaners, semiconductor processing, disinfection, waste water treatment, and as a selective oxidizer for functional groups in organic syntheses.

The present invention further comprises an improved method of microetching a surface wherein the improvement comprises contacting the surface to be etched with a microetching solution containing potassium monopersulfate solution of the present invention having an active oxygen content of from about 3.4% to about 6.8%. This improved method is useful for etching metal surfaces, for example in processes to etch printed wiring boards or semiconductors. The production of modern printed wiring boards, for developing desired electrically conductive patterns onto plastic or other insulator substrates clad with copper foil is a complex process, often involving 100 or more individual steps. Careful removal (termed "microetching") of excess copper, reagents remaining from the copper deposition, powder, dust, oxides, and other debris or residuals after each construction step is required. The microetching process involves contacting the printed wiring boards with a solution containing the potassium monopersulfate solution of the present invention (typically as a bath, or conveyorized spray process), microetching and cleaning of copper clad printed wiring board substrates, and removing the solution together with undesired residues. The $KHSO_5$ active ingredient is consumed during microetching, forming sulfate salts. Thus, the copper sulfate concentration in the solution increases. While additional potassium monopersulfate may be added to supplement decreasing active oxygen, the sulfate salts build up. The useful life of the bath is limited by the buildup of sulfate salts and must then be replaced, else staining of the boards occurs and quality declines. The higher active oxygen and lower inert sulfate concentrations of the solutions of the present invention result in a higher metal loading capacity in such processes when used as microetching solutions. Also, the useful life of the solution when used as a microetching bath is extended in time due to the lower initial $SO_4$ content of the solution. The solutions of the present invention have a copper loading capacity of at least 27 g per liter of solution, preferably at least 29 g per liter solution, and more preferably 30 g per liter solution. Bath activity and throughput are increased, and bath life is extended since sulfate ($SO_4$) concentrations are substantially reduced as shown in Table 3 through higher active oxygen to sulfate ratios. Bath life is increased when using the solutions of the present invention compared to prior art complete saturated solutions and to the solutions of U.S. Pat. No. 6,818,142.

The copper or copper alloy clad substrates subjected to microetching comprise any plies of plastic, fiber glass or other material to which copper foil is adhered or upon which copper is deposited, electrolessly or electrolytically. The substrates can be single or multiple plies in the form of composite or layered structures such as laminates and other materials. Such copper clad substrates and laminates are conventional in the printed wiring board art. The substrates may contain through-holes on the walls of which copper has been deposited for electrical connection, or miniaturized interlayer through-hole (microvia) technology. In modern high-density circuit boards, microvia have replaced through-holed to provide better space utilization. Single laminates or multilayer boards must be microetched and cleaned, usually numerous times during printed wiring board fabrication. Application of the microetching and cleaning solution is usually by spraying or immersion of copper clad substrates in a bath formed with the etching solution, and the solution can be applied in any other convenient manner.

The high active oxygen solutions of the present invention are also useful as a component of chemical-mechanical polishing slurries. Such slurries are used for polishing metal layers and thin films associated with semiconductor manufacture.

Typical semiconductor integrated circuits are made up of millions of active devices formed in or on a silicon substrate. The active devices, which are initially isolated from one another, are united to form functional circuits and components. The devices are interconnected through the use of well-known multilevel interconnections. Interconnection structures normally have a first layer of metallization, an interconnection layer, a second level of metallization, and sometimes a third and subsequent levels of metallization. Interlevel dielectrics, such as doped and undoped silicon dioxide ($SiO_2$), are used to electrically isolate the different levels of metallization in a silicon substrate or well. The electrical connections between different interconnection levels are made through the use of metallized vias. Metal contacts are used to form electrical connections between interconnection levels and devices formed in a well.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry", is deposited onto the pad during polishing. The slurry initiates the polishing process by chemically reacting with the film being polished. The rotational movement of the pad relative to the substrate facilitates the polishing process as slurry is provided to the wafer/pad interface. Polishing is continued in this manner until the desired film on the insulator is removed.

The slurry composition is an important factor in the chemical mechanical polishing step. Depending on the choice of the oxidizing agent, the abrasive, and other useful additives, the polishing slurry can be tailored to provide effective polishing to metal layers at desired polishing rates while minimizing surface imperfections, defects, corrosion and erosion. Furthermore, the polishing slurry may be used to provide controlled polishing selectivity to other thin-film materials used in current integrated circuit technology such as titanium, titanium nitride and the like. The concentrated solution of the present invention is an excellent oxidizing agent in such a slurry.

MATERIALS AND TEST METHODS

The following materials and test methods were used in the Examples herein.

Materials

OXONE brand of potassium monopersulfate compound available from E. I. du Pont de Nemours and Company, Wilmington, Del., was employed.

Active Oxygen Measurement

In all examples, active oxygen concentrations are expressed in weight % and are determined by standard iodometric titration as described in the "OXONE Monopersulfate Compound Technical Information" Bulletin, No. H-42434-5, dated April 2000, published by E. I. du Pont de Nemours and Company. Briefly, a weighed aliquot of the solution to be analyzed is diluted with cold deionized water, acidified, treated with potassium iodide, and titrated with standardized 0.1N sodium thiosulfate reagent to an endpoint visualized by a starch indicator. The active oxygen (AO) content is calculated as follows:

% $AO = (mL_{titrant} \times Normality_{titrant} \times 0.8)/(Grams_{sample})$

Equivalently, the % $KHSO_5$ concentration may be calculated by:

% $KHSO_5 = \% AO/0.105$

EXAMPLES

Example 1

OXONE (600 g) was slurried in deionized water (325 g) and potassium hydroxide solution (37.9%, 120.9 g) was slowly added with mixing over about 10 min. to neutralize 90% of the $KHSO_4$ present. The total OXONE:water ratio was 600:400 (including water added in the potassium hydroxide solution). Mixing was continued for 2 h. After mixing solids were separated from the filtrate with a fritted glass funnel using vacuum filtration. The resulting filtrate solution contained 34.71% $KHSO_5$, and had 3.65% active oxygen, an $AO/SO_4$ ratio of 1.05:1, a % $SO_4$ content of 3.5, an active oxygen yield of 85.1%, and an active oxygen stability of $t_{10\%}=8$ days, where $t_{10\%}$ is the time for a 10% loss of active oxygen.

Example 2

OXONE (600 g) was slurried in deionized water (334 g) and potassium hydroxide solution (37.9%, 106.3 g) was slowly added with mixing over about 10 min. to neutralize 79.4% of the $KHSO_4$ present. The total OXONE:water ratio was 600:400 (including water added in the potassium hydroxide solution). Mixing was continued for 2 h. After mixing, the solid was separated from the filtrate with a fritted glass funnel using vacuum filtration. The resulting filtrate solution contained 35.23% $KHSO_5$, and had 3.71% active oxygen, a % $SO_4$ of 4.7, an $AO/SO_4$ ratio of 0.79:1, an active oxygen yield of 85.83%, and an active oxygen stability of $t_{10\%}=14$ days, where $t_{10\%}$ is the time for a 10% loss of active oxygen.

Example 3

OXONE (1100 g) was slurried in deionized water (403 g) and potassium hydroxide solution (37.9%, 186.32 g) was slowly added with mixing over about 10 min. to neutralize 76% of the $KHSO_4$ present. The total OXONE:water ratio was 1100:228 (including water added in the potassium hydroxide solution). Mixing was continued for 2 h. After mixing, the solid was separated from the filtrate with a fritted glass funnel using vacuum filtration. The resulting filtrate solution contained 42.66% $KHSO_5$, and had 4.49% active oxygen, and had an $AO/SO_4$ ratio of 0.83:1, an active oxygen yield of 60.24%, and an active oxygen stability of $t_{10\%}=16$ days, where $t_{10\%}$ is the time for a 10% loss of active oxygen.

Example 4

The pH of a high strength liquid OXONE solution, prepared as in Example 2, was adjusted with 85% H3PO4%, to a pH of 0.63 and diluted with deionized water to an active oxygen concentration of 3.0% for comparative stability testing. The resulting solution had an % $SO_4$ of 3.8, an $AO/SO_4$ ratio of 0.71:1. The active oxygen was 3.71% at preparation, and the active oxygen stability was $t_{10\%}=20$ days.

Example 5

OXONE (600 g) was slurried in deionized water (320.73 g) and potassium hydroxide solution (37.9%, 127.7 g) was slowly with mixing added over about 10 min. to neutralize 95% of the $KHSO_4$ present. The total OXONE:water ratio was 600:400 (including water added in the potassium hydroxide solution). Mixing was continued for 2 h. After mixing, the solid was separated from the filtrate with a fritted glass funnel using vacuum filtration. A sample of the resulting filtrate was diluted to 3.0% active oxygen and the pH was lowered to 0.44 using 20% sulfuiric acid (92.82 g). The active oxygen stability of this adjusted solution was $t_{10\%}=18$ days. The % $SO_4$ was 2.7, the $AO/SO_4$ ratio was about 1.35:1, the active oxygen was 3.68% as prepared before any adjustment.

Example 6

Example 6 was prepared using a mechanical stirrer to slurry OXONE (653.25 g) with water (266.83 g). Potassium hydroxide solution of about 36% was slowly added over 20 minutes to neutralize 80% of the available $KHSO_4$, and the solution mixed for 2 h. The temperature was maintained at 60°±5° F.(° C.±° C.). The total water present was 346.75 g, including 79.92 g from the potassium hydroxide solution. After mixing, the solid was separated from the filtrate with a fritted glass funnel using vacuum filtration. The process produced 530.6 grams of filtrate and 497.5 grams of wet cake. The resulting filtrate had a pH of 0.69, contained 4.2% active oxygen, and had a $t_{10\%}=13$ days.

Example 7

Example 7 was prepared as described in Example 6, except that the pH of the filtrate was adjusted with aqueous sulfuric acid (19.4%) and water. 102.18 grams material prepared in Example 6 was mixed with 17.84 grams of water and 4.04 grams of a 19.4% sulfuric acid solution. The acid was added to maintain the same pH as example 6. The resulting solution had an active oxygen content of 3.5% and a pH of 0.66.

Example 8

Examples 8 was prepared as described in Example 6, except that the pH of the filtrate was adjusted with aqueous sulfuric acid (19.4%) and water. 88.45 grams material prepared in Example 6 was mixed with 31.55 grams of water and 5.02 grams of a 19.4% sulfuric acid solution. The acid was added to maintain the same pH as Example 6. The resulting solution had an active oxygen content of 3.0% and a pH of 0.64.

Comparative Example A

Comparative Example A was prepared as for the "Conventional Complete Solution" described in Table 2 of Example 1 of U.S. Pat. No. 6,818,142. A 11.2% potassium monopersulfate solution was prepared by dissolving OXONE (12.6 g) potassium monopersulfate in deionized water (100 g) at a temperature of 22° C. The OXONE was mixed until completely dissolved. The resulting solution produced was prepared below the saturation limit expressed in Table 1 above. The resulting solution contained 0.51% active oxygen, 5.00% $KHSO_5$, 2.54% $KHSO_4$, pH=1.2, 10.56% total dissolved solids (TDS), and a 0.15:1 weight ratio of $AO/SO_4$. A rate constant was derived from the data in Table 2 of U.S. Pat. No. 6,818,142 and found to be k=0.0062. Using Equation 1 above, the value of $t_{10\%}$ was 17 days, where $t_{10\%}$ is the time it takes to loose 10% of the active oxygen.

Comparative Example B

Comparative Example B was prepared as described in Example 1 of U.S. Pat. No. 6,818,142. OXONE potassium monopersulfate (104 g, 4.52% active oxygen as the solid) was slurried with deionized water (52 g), equivalent to 200 g OXONE per 100 g water). The slurry was stirred overnight at ambient room temperature (22° C. +/−2° C.) and then filtered through a coarse glass filter funnel to remove undissolved potassium sulfate and bisulfate salts. The clear filtrate was analyzed. The resulting solution contained 2.98% active oxygen, 28.4% $KHSO_5$, 13.5% $KHSO_4$, pH=0.9, 49.4% total dissolved solids (TDS), and a 0.22:1 weight ratio of $AO/SO_4$. The rate constant was derived from the data in Table 2 of U.S. Pat. No. 6,818,142 and found to be k=0.0062. Using Equation 1 the $t_{10\%}$=18 days, where $t_{10\%}$ is the time it takes to loose 10% of the active oxygen.

Comparative Example C

A complete saturated solution was prepared by dissolving OXONE potassium monopersulfate to the solubility limit, expressed in Table 1, at a temperature of 20° C. OXONE (30 g) was dissolved in water (100 g) at 20° C. and mixed until completely dissolved. The resulting solution had 1.08% active oxygen, 10.34% $KHSO_5$, 4.74% $KHSO_4$, 21.89% TDS, and an $AO/SO_4$ weight ratio of 0.15:1

TABLE 2

| | As Prepared | | As Tested for Shelf Life Stability at 35° C. | | | | |
|---|---|---|---|---|---|---|---|
| Description | pH | % AO | pH | % AO | Rate K | $t_{10\%}$ (days) | Days to 2.7% AO* |
| Examples of the prior art | | | | | | | |
| Comp. Ex. A | 0.5 | 0.51 | 0.51 | 0.51 | 0.0062 | 17 | (a) |
| Comp. Ex. B | 0.5 | 2.98 | 0.5 | 2.98 | 0.0060 | 18 | 16 |
| Examples of the Present Invention | | | | | | | |
| Example 1 | 1.43 | 3.65 | 1.50 | 3.0 | 0.0126 | 8 | 8.4 |
| Example 2 | 0.98 | 3.71 | 1.14 | 3.0 | 0.0074 | 14 | 14.2 |
| Example 3 | 0.69 | 4.49 | 1.05 | 3.0 | 0.0065 | 16 | 16.2 |
| Example 4 | 0.98 | 3.71 | 0.63 | 3.0 | 0.0053 | 20 | 19.9 |
| Example 5 | 1.50 | 3.68 | 0.44 | 3.0 | 0.0059 | 18 | 17.9 |
| Example 6 | 0.69 | 4.2 | 0.69 | 4.2 | 0.0083 | 13 | 53.2 |
| Example 7 | 0.69 | 4.2 | 0.66 | 3.5 | 0.0054 | 20 | 48.1 |
| Example 8 | 0.69 | 4.2 | 0.64 | 3.0 | 0.0046 | 23 | 23 |

*Calculated from Equation 1 wherein, $t = \ln(C_0/C)/K$, using C = 2.7, and C0 = as tested AO]
(a) The starting % AO for Comparative Example A is already below the 2.7% AO specification.

Table 2 shows the higher percent active oxygen obtained in the solutions of the present invention. The rate of active oxygen loss (K) increased with higher percent active oxygen solutions and also increasing pH. It is also shown that addition of acid back to the filtrate to reduce the pH down to about 0.6 was useful to increase active oxygen stability over the higher pH from the $KHSO_4$ neutralizing step. Table 2 shows that both pH and concentration influenced the rate at which active oxygen was lost (stability). Moreover, it is shown in Table 2 that the pH had a greater effect than concentration in the active oxygen stability. Solutions of the present invention produced solutions with better rate constants and with tripled shelf life as measured by the time to decrease to 2.7% active oxygen.

TABLE 3

| | % Neutralized | % $SO_4$ | Composition (Wt %) | | | | |
|---|---|---|---|---|---|---|---|
| Description | | | $KHSO_5$ | $KHSO_4$ | $K_2SO_4$ | H20 | TDS* |
| Comparative Examples of the Prior Art | | | | | | | |
| Comp. Ex. B | 0 | 13.7 | 28.4 | 13.5 | 7.5 | 50.6 | 49.4 |
| Comp. Ex. C | 0 | 7.1 | 10.34 | 4.74 | 6.81 | 78.11 | 21.89 |
| Examples of the Present Invention | | | | | | | |
| Example 1 | 90 | 3.5 | 34.71 | 1.38 | 4.57 | 59.34 | 40.66 |
| Example 2 | 79 | 4.7 | 35.23 | 3.47 | 4.11 | 57.19 | 42.81 |
| Example 5 | 95 | 2.7 | 35.04 | 1.10 | 3.54 | 60.32 | 39.68 |

TDS: Total dissolved solids

Table 3 shows the solutions of the present invention provided lower percent $SO_4$. The Examples of the present invention resulted in lower sulfate concentrations in use than the Comparative Examples. During microetching for example, $KHSO$ is consumed to form sulfates. Since bath life is determined by sulfate concentration and residual active oxygen, the lower percent sulfate provided longer bath life.

Example 9

A 1000-gram batch size was slurried at 10° C. using OXONE (642 g) and water (358 g). Potassium hydroxide solution (122.7 g of a 36.4%) was used to neutralize 80% of the $KHSO_4$ to $K_2SO_4$. The water in the potassium hydroxide solution was included when calculating the OXONE:water ratio. The slurry mixture was then mechanically stirred for 2 h. After mixing, solids were separated from the filtrate with a fritted glass funnel using vacuum filtration. The filtrate composition results and active oxygen are shown in Table 4.

Examples 10 to 12

Examples 10 to 12 were prepared as described in Example 9 using the indicated OXONE:water ratio and the corresponding temperature of 10° C. or 20° C. indicated in Table 4. The amount of KOH was varied slightly corresponding to the amount of OXONE used so as to neutralize 80% of the $KHSO_4$ present in the triple salt. The filtrate composition results and active oxygen are shown in Table 4.

TABLE 4

| | Starting | | | Example Composition (wt. % in Filtrate) | | | | | | |
|---|---|---|---|---|---|---|---|---|---|---|
| Ex. # | Temp ° C. | OXONE fraction | Water fraction | $KHSO_5$ | $KHSO_5$ Yield (%) | $KHSO_4$ | $K_2SO_4$ | $H_2O$ | % TDS* | % $SO_4$ | AO % |
| 9 | 10 | 0.642 | 0.358 | 39.00 | 70.8 | 4.84 | 1.66 | 54.49 | 45.50 | 4.3 | 4.1 |
| 10 | | 0.800 | 0.200 | 47.10 | 36.0 | 2.80 | 1.76 | 48.34 | 51.66 | 2.9 | 5.0 |

TABLE 4-continued

| | Starting | | | Example Composition (wt. % in Filtrate) | | | | | | |
|---|---|---|---|---|---|---|---|---|---|---|
| Ex. # | Temp °C. | OXONE fraction | Water fraction | KHSO$_5$ | KHSO$_5$ Yield (%) | KHSO$_4$ | K$_2$SO$_4$ | H$_2$O | % TDS* | % SO$_4$ | AO % |
| 11 | 20 | 0.653 | 0.347 | 39.57 | 80.0 | 5.25 | 2.33 | 52.85 | 47.15 | 5.0 | 4.2 |
| 12 | | 0.800 | 0.200 | 51.26 | 47.4 | 3.1 | 1.81 | 43.83 | 56.17 | 3.2 | 5.4 |

*K$_2$SO$_4$ has been calculated by difference using: K$_2$SO$_4$ = % TDS − (KHSO$_5$ + KHSO$_4$), because of additives and impurities actual values are slightly less than shown.
*% TDS is % total dissolved solids.

Table 4 shows how the active oxygen concentration as well as the percent SO$_4$ was affected by the ratio of OXONE:water. Table 4 also shows how, by performing the slurry extraction of the KHSO$_5$ at a slightly higher temperature, a higher percentage of KHSO$_5$ was transferred to the aqueous solution if mixed for equal times. The higher mixing temperature helped overcome the endothermic heat of solution of the triple salt.

What is claimed is:

1. A composition comprising a stable solution of potassium monopersulfate having an active oxygen content of from about 3.5% to about 6.8% by weight and a maximum SO$_4$ content of about 5.5% by weight.

2. The composition of claim 1 having an active oxygen content of from about 3.6% to about 6.8% by weight.

3. A composition comprised of claim 1 having a maximum SO$_4$ content of 5.0% by weight.

4. The composition of claim 3 having a pH of from about 0.4 to about 1.5.

5. The composition of claim 1 further comprising an adjuvant selected from the group consisting of a mineral acid other than hydrochloric acid, a C$_1$ to C$_4$ organic acid, a surfactant, a stabilizer, and an etch rate modifier.

6. A process for the preparation of a solution of potassium monopersulfate having an active oxygen content of from about 3.5% to about 6.8% by weight and a maximum SO$_4$ content of about 5.5% by weight comprising a) mixing to form an equilibrated slurry: i) solid 2KHSO$_5$.KHSO$_4$.K$_2$SO$_4$, ii) a quantity of water insufficient to completely dissolve the solid, and iii) an alkaline material; and b) separating undissolved solids to obtain a stable solution.

7. The process of claim 6 wherein the alkaline material is added after the solid 2KHSO$_5$.KHSO$_4$.·K$_2$SO$_4$ and water have been mixed.

8. The process of claim 6 wherein the alkaline material is selected from the group consisting of sodium hydroxide, potassium hydroxide, barium hydroxide, magnesium hydroxide, sodium carbonate, potassium carbonate, sodium bicarbonate or potassium bicarbonate.

9. The process of claim 6 wherein from about 25 g to about 70 g of water is employed per 100 g of 2KHSO$_5$.KHSO$_4$.K$_2$SO$_4$.

10. The process of claim 6 wherein during the addition of the alkaline material a temperature at or below 40° C. is maintained.

11. The process of claim 6 wherein the water is deionized water.

12. The process of claim 6 wherein the active oxygen content of the solution obtained is from about 3.6% to about 6.8% by weight.

13. The process of claim 6 further comprising, after separating undissolved solids, adding an adjuvant selected from the group consisting of a mineral acid other than hydrochloric acid, a C$_1$ to C$_4$ organic acid, a surfactant, a stabilizer, and an etch rate modifier.

14. The process of claim 6 further comprising adding acid to the solution obtained to adjust the pH to a range of from about 0.4 to about 1.5.

* * * * *